(12) United States Patent
Ho et al.

(10) Patent No.: US 9,241,435 B2
(45) Date of Patent: Jan. 19, 2016

(54) ELECTRONIC DEVICE HOUSING AND METHOD FOR MANUFACTURING THE SAME

(71) Applicants: Po-Feng Ho, New Taipei (TW); Shi-Jie Yan, Shenzhen (CN)

(72) Inventors: Po-Feng Ho, New Taipei (TW); Shi-Jie Yan, Shenzhen (CN)

(73) Assignees: SHENZHEN FUTAIHONG PRECISION INDUSTRY CO., LTD., Shenzhen (CN); FIH (Hong Kong) Limited, Kowloon (HK)

( * ) Notice: Subject to any disclaimer, the term of this patent is extended or adjusted under 35 U.S.C. 154(b) by 477 days.

(21) Appl. No.: 13/709,472

(22) Filed: Dec. 10, 2012

(65) Prior Publication Data

US 2013/0321988 A1 Dec. 5, 2013

(30) Foreign Application Priority Data

Jun. 1, 2012 (CN) .......................... 2012 1 0177667

(51) Int. Cl.
*H05K 1/03* (2006.01)
*H05K 13/00* (2006.01)
*H05K 7/00* (2006.01)
*H01Q 1/40* (2006.01)
*H05K 3/18* (2006.01)

(52) U.S. Cl.
CPC ............. *H05K 13/0046* (2013.01); *H01Q 1/40* (2013.01); *H05K 3/184* (2013.01); *H05K 7/00* (2013.01); *H05K 2201/0236* (2013.01); *H05K 2201/0999* (2013.01)

(58) Field of Classification Search
USPC .......................... 174/250, 251, 253–258, 268
See application file for complete search history.

(56) References Cited

FOREIGN PATENT DOCUMENTS

| TW | 200806135 | 1/2008 |
|----|-----------|--------|
| TW | M397039 U1 | 1/2011 |
| TW | M425335 U1 | 3/2012 |
| TW | M430013 U1 | 5/2012 |

*Primary Examiner* — Tremesha S Willis
(74) *Attorney, Agent, or Firm* — Novak Druce Connolly Bove + Quigg LLP

(57) ABSTRACT

An electronic device housing includes a plastic substrate. The plastic substrate includes a first surface. The electronic device housing further includes an activating layer formed on the first surface. The activating layer contains metal powder. The activating layer defines a recessed portion. Some of the metal powder is partially exposed on the surface of the recessed portion. Some of metal powder is partially inserted into the plastic substrate corresponding to the recessed portion. The electronic device housing further includes an antenna layer formed on the recessed portion. The antenna layer is a metal layer. A method for manufacturing the electronic device housing is also disclosed.

16 Claims, 4 Drawing Sheets

ELECTRONIC DEVICE HOUSING AND METHOD FOR MANUFACTURING THE SAME

BACKGROUND

1. Technical Field

The present disclosure relates to an electronic device housing and a method for manufacturing the electronic device housing.

2. Description of Related Art

The internal antenna of an electronic device can be formed by the following steps: a plastic substrate is provided, the plastic substrate is made of thermoplastic containing laser activator, the laser activator includes a laser sensitive metal complex that can be activated and precipitate metal when exposed to the laser light; metal is precipitated and exposed on the surface of the plastic substrate due to the plastic substrate being laser activated; and a metal antenna layer is formed on the laser-activated plastic substrate by electroplating. However, laser activator used for forming the plastic substrate is expensive, increasing the production costs of electronic device. Furthermore, the plastic substrate becomes brittle and the strength of the plastic substrate decreases due to the laser activator, thus the plastic substrate coated with the metal antenna cannot be suitable to use as housing for electronic device.

Therefore, there is room for improvement within the art.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the exemplary plastic composite and method for manufacturing the plastic composite. Moreover, in the drawings like reference numerals designate corresponding parts throughout the several views. Wherever possible, the same reference numbers are used throughout the drawings to refer to the same or like elements of an embodiment.

DETAILED DESCRIPTION

Figure 2:
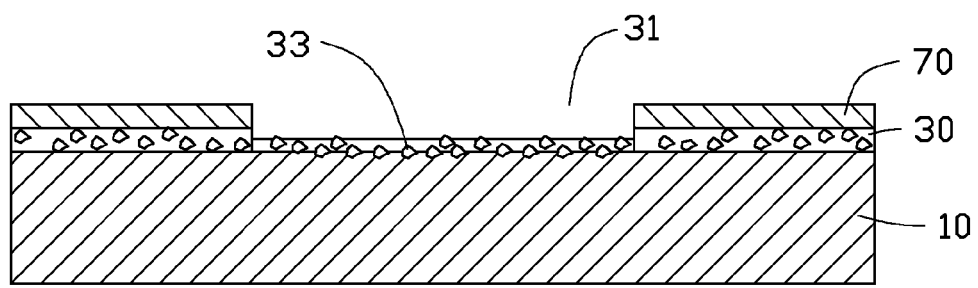
FIG. 2 is a cross-sectional view of the substrate of FIG. 1 treated by laser etching.
Figure 3:
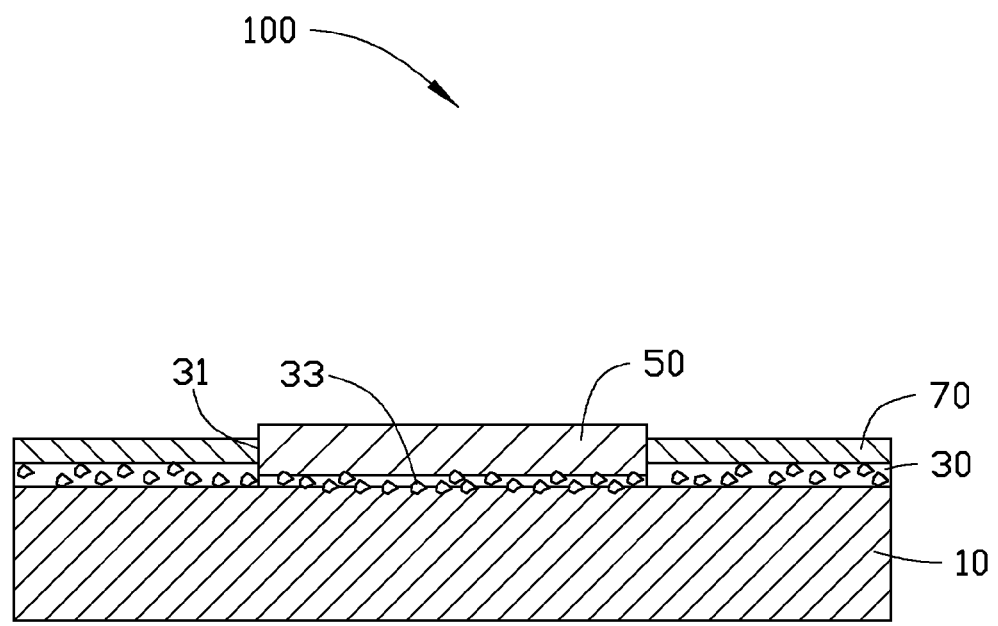
FIG. 3 is a cross-sectional view of first embodiment of an electronic device housing.

Referring to FIGS. 2 and 3, an electronic device housing 100 according to a first exemplary embodiment includes a plastic substrate 10 and an activating layer 30 formed on the plastic substrate 10. The activating layer 30 contains metal powder 33. The activating layer 30 defines a recessed portion 31. An antenna layer 50 is formed on the recessed portion 31. The antenna layer 50 is a metal layer. A non-conductive shielding layer 70 is formed on the activating layer 30 except for areas defining the recessed portion 31. Some of the metal powder 33 is partially inserted into the plastic substrate 10 corresponds to the recessed portion 31.

The plastic substrate 10 can be formed by insert molding. The plastic substrate 10 can be made of thermoplastic resin material or thermosetting resin material. The thermoplastic resin material is selected from a group consisting of polyvinylchloride (PVC), polyethylene terephthalate (PET), acrylonitrile-butadiene-styrene plastics (ABS), polycarbonate (PC), Polyimide (PI), liquid crystal polymer (LCP), polyetherimide (PEI), polyphenylene sulfide (PPS), polystyrene (PS), glycol-modified polyester or polypropylene (PP). The thermosetting resin material is selected from a group consisting of epoxy resin, phenolic resin (PF), thermosetting polyurethane and silicone resin.

The activating layer 30 is an ultraviolet (UV) paint layer or a thermosetting paint layer containing metal powder 33. The metal powder 33 can be copper, silver, palladium and the like. The thickness of the activating layer 30 is about 15 μm to about 20 μm.

The depth of the recessed portion 31 is about 20 μm to about 35 μm. Some of the metal powder 33 is partially exposed on the surface of the recessed portion 31. That is, the recessed portion 31 is inserted with some of the metal powder 33.

The antenna layer 50 is formed by electroplating or electroless plating. The antenna layer 50 is a nickel layer, or composite layer containing a copper layer and a nickel layer formed within the recessed portion 31 in that order. The antenna layer 50 has a thickness of about 10 μm to about 30 μm.

The shielding layer 70 is a UV paint layer or a thermosetting paint layer. The shielding layer 70 has a thickness of about 15 μm to about 25 μm.

Figure 4:
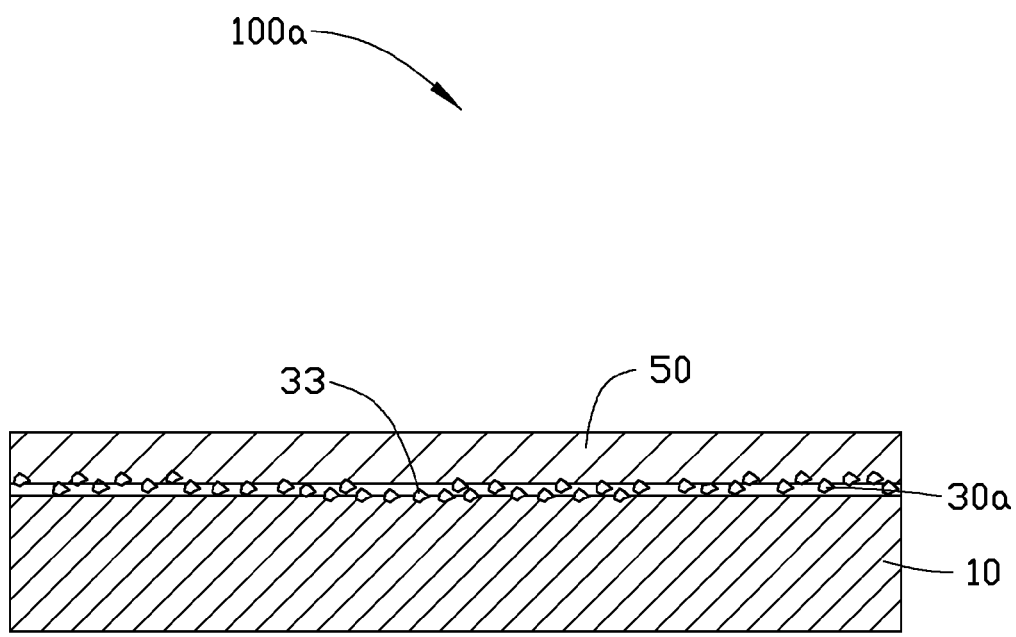
FIG. 4 is a cross-sectional view of second embodiment of an electronic device housing.

Referring to FIG. 4, an electronic device housing 100a according to a second exemplary embodiment includes a plastic substrate 10 and a activating layer 30a formed on the plastic substrate 10. The activating layer 30a contains metal powder 33. Some of metal powder 33 is partially exposed on the outer surface of the activating layer 30a, and some of metal powder 33 is partially inserted into the plastic substrate 10 corresponding to the recessed portion 31. An antenna layer 50 is formed on the activating layer 30a. The antenna layer 50 is a metal layer formed by electroplating or electroless plating.

The activating layer 30a is an UV paint layer or a thermosetting paint layer containing metal powder 33. The metal powder 33 can be copper, silver, palladium and the like. Portions of the activating layer 30 covered with shielding layer 70 has a thickness of about 6 μm to about 10 μm.

Figure 1:
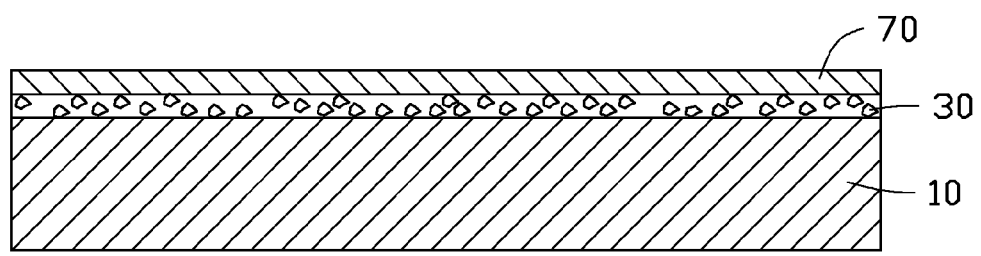
FIG. 1 is a cross-sectional view of first embodiment of a substrate coated with a shielding layer.

Referring to FIG. 1, a method for manufacturing the electronic device housing 100 may includes at least the following steps:

A plastic substrate 10 is provided. The plastic substrate 10 can be formed by insert molding. The plastic substrate 10 can be made of thermoplastic resin material or thermosetting resin material. The thermoplastic resin material is selected from a group consisting of PVC, PET, ABS, PC, PI, LCP, PEI, PPS, PS, glycol-modified polyester or PP. The thermosetting resin material is selected from a group consisting of epoxy resin, PF, thermosetting polyurethane and silicone resin.

The activating layer 30 is formed on the plastic substrate 10 by spraying. The paint used for forming the activating layer 30 is UV curable paint or bakeable paint containing metal powder 33. In the embodiment, the paint used for forming the activating layer 30 is bakeable paint, wherein the mass percentage of the metal powder is about 20%-34%. The metal powder 33 can be copper, silver, palladium and the like. A spray gun is provided for spray painting to form the activating layer 30. The spraying pressure of the spray gun is about 0.3 MPa-0.5 MPa. During spraying, the distance between the plastic substrate 11 and the spray gun is about 20 cm to about 30 cm. The bakeable paint levels evenly on the plastic substrate 10 at an ambient temperature of about 20° C.-25° C. for about 5 min-10 min. The bakeable paint is solidified at a temperature of about 60° C.-80° C. for about 20 min-30 min. After solidification, the activating layer 30 has a thickness of about 15 μm-20 μm.

The shielding layer 70 is formed on the activating layer 30 by spraying. The paint used for forming the shielding layer 70 is UV curable paint or bakeable paint. In the embodiment, the paint used for forming the shielding layer 70 is UV curable paint. The UV curable paint is a "UC-925-C7" type UV curable paint provided by Berger Industrial Coating Company Limited. The spraying pressure of the spray gun is about 0.3 MPa-0.5 MPa. During spraying, the distance between the plastic substrate 11 and the spray gun is about 20 cm to about 30 cm. The thermosetting paint levels evenly on the plastic substrate 10 at an ambient temperature of about 20° C.-25° C. for about 5 min-10 min. After spraying, the UV paint is exposed to UV light having a wavelength of about 350 nm to about 400 nm and an energy of between about 800 mJ/cm$^2$ to about 1200 mJ/cm$^2$ for about 1 min to about 1.5 min to solidify. After solidification, the shielding layer 70 has a thickness of about 15 μm to about 25 μm.

The recessed portion 31 is defined on the activating layer 30 by laser activating. Portions of the activating layer 30 are laser-activated under the following parameters: a frequency of laser beam of about 18 KHz to about 20 KHz, a power of about 2 kW to about 2.5 kW, a scanning rate of about 300 mm/s to about 500 mm/s, and a scanning energy of about 0.1 mJ to about 0.12 mJ.

During the laser activating, some of the metal powder 33 is exposed and covered on the surface of the recessed portion 31 to provide a conductivity property to the plastic substrate 10. Some of the metal powder 33 is moved into the plastic substrate 10 which is softened/melted by the laser activating, enhancing the bond between the plastic substrate 10 and subsequent layers formed on the recessed portion 31. Furthermore, the laser-activated activating layer 50 become rough due to some of organic materials in the activating layer 30 being removed or melted, and can further enhance the bond between the plastic substrate 10 and subsequent layers.

The antenna layer 50 is formed on the recessed portion 31 by electroplating or electroless plating. In the embodiment, the antenna layer 50 is a nickel layer. The plastic substrate 10 is immersed in an electroless water solution comprises 45 g/L-50 g/L nickel sulfate, 45 g/L-60 g/L hypophosphite, 20 g/L-30 g/L sodium citrate, and 20 g/L-30 g/L ammonium chloride at a temperature from about 83° C. to about 87° C. for about 30 min to about 50 min, the pH range of the electroless water solution is about 8.5-9.5. The antenna layer 50 has a thickness of about 10 μm to about 30 μm.

Alternatively, the antenna layer 50 can be a composite layer contains a copper layer and a nickel layer.

Unlike the first exemplary embodiment, in the second exemplary embodiment, the method for manufacturing the electric device housing 100a does not include the step of forming the shielding layer 70 on the activating layer 50. The activating layer 30a is laser-activated, and then the antenna layer 50 is directly covered on the outer surface of the laser-activated activating layer 30a. Except the above difference, the remaining conditions of the second exemplary embodiment were same as the first exemplary embodiment.

The plastic substrate is made of materials containing no laser activator, which can reduce the cost of production and allow the plastic substrate 11 coated with the antenna layer 30/30a to be used as housing for electronic device. The antenna layer can be directly formed on the laser-activated activating layer 30/30a without the plastic substrate 10 subjected to activating or roughing process. Furthermore, the laser activating can provides a security bond between the activating layer 30/30a and the antenna layer 50.

It is to be understood, however, that even through numerous characteristics and advantages of the exemplary disclosure have been set forth in the foregoing description, together with details of the system and function of the disclosure, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An electronic device housing comprising:
   a plastic substrate, the plastic substrate comprising a first surface;
   an activating layer formed on the first surface, the activating layer comprising metal powder, the activating layer defining a recessed portion, some of the metal powder being partially exposed on a surface of the recessed portion, some of the metal powder being partially inserted into the plastic substrate corresponding to the recessed portion; and
   an antenna layer formed on the recessed portion, the antenna layer being a metal layer;
   wherein the activating layer is an ultraviolet paint layer or a thermosetting paint layer containing metal powder.

2. The electronic device housing of claim 1, wherein the metal powder is copper, silver or palladium.

3. The electronic device housing of claim 1, wherein a thickness of the activating layer is about 15 μm to about 20 μm.

4. The electronic device housing of claim 1, wherein the antenna layer has a thickness of about 10 μm to about 30 μm.

5. The electronic device housing of claim 1, wherein the antenna layer is a nickel layer, or composite layer containing a copper layer and a nickel layer.

6. The electronic device housing of claim 1, further comprising a non-conductive shielding layer formed on the activating layer except for areas defining the recessed portion.

7. The electronic device housing of claim 6, wherein the shielding layer is an ultraviolet paint layer or a thermosetting paint layer.

8. The electronic device housing of claim 7, wherein the shielding layer has a thickness of about 15 μm to about 25 μm.

9. The electronic device housing of claim 1, wherein a depth of the recessed portion is about 20 μm to about 35 μm.

10. An electronic device housing comprising:
    a plastic substrate;
    an activating layer formed on the plastic substrate, the activating layer comprising metal powder, some of the metal powder being partially exposed on an outer surface of the activating layer, some of the metal powder being partially inserted into the plastic substrate; and
    an antenna layer formed on the activating layer, the antenna layer being a metal layer;
    wherein the activating layer is an ultraviolet paint layer or a thermosetting paint layer containing metal powder.

11. The electronic device housing of claim 10, wherein the activating layer has a thickness of about 6 μm to about 10 μm.

12. A method for manufacturing an electronic device housing, comprising:
    providing a plastic substrate;
    forming an activating layer on the plastic substrate, the activating layer comprising metal powder;
    forming a non-conductive shielding layer formed on the activating layer;

laser activating the plastic substrate and defining a recessed portion on the activating layer; and forming an antenna layer on the recessed portion, the antenna layer being a metal layer;

wherein a paint used for forming the activating layer is ultraviolet curable paint or bakeable paint comprising metal powder, and in the ultraviolet curable paint or bakeable paint, a mass percentage of the metal powder is about 20%-34%.

13. The method for manufacturing an electronic device housing, of claim 12, wherein portions of the activating layer are laser-activated under the following parameters: a frequency of laser beam of about 18 KHz to about 20 KHz, a power of about 2 kW to about 2.5 kW, a scanning rate of about 300 mm/s to about 500 mm/s, and a scanning energy of about 0.1 mJ to about 0.12 mJ.

14. The method for manufacturing an electronic device housing, of claim 12, wherein the antenna layer is formed by electroplating or electroless plating.

15. The electronic device housing of claim 1, wherein a mass percentage of the metal powder is about 20%-34%.

16. The electronic device housing of claim 10, wherein a mass percentage of the metal powder is about 20%-34%.

\* \* \* \* \*